(12) United States Patent
Shimizu

(10) Patent No.: US 6,195,153 B1
(45) Date of Patent: Feb. 27, 2001

(54) SCANNING TYPE EXPOSURE DEVICE HAVING INDIVIDUALLY ADJUSTABLE OPTICAL MODULES AND METHOD OF MANUFACTURING SAME

(75) Inventor: Kenji Shimizu, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/316,768

(22) Filed: May 21, 1999

(30) Foreign Application Priority Data

May 22, 1998 (JP) .................................................. 10-140918
May 7, 1999 (JP) .................................................. 11-126897

(51) Int. Cl.[7] .......................... G03B 27/42; G03B 27/52; G03B 27/54
(52) U.S. Cl. .................................. 355/53; 355/55; 355/67
(58) Field of Search .................................. 355/53, 55, 67, 355/77, 30, 72, 75; 356/399–401; 250/548; 430/5, 20, 22, 30

(56) References Cited

U.S. PATENT DOCUMENTS

| | | | |
|---|---|---|---|
| 5,539,521 | * 7/1996 | Otokake et al. | 356/371 |
| 5,617,211 | * 4/1997 | Nara et al. | 356/401 |
| 5,640,227 | * 6/1997 | Kato et al. | 355/53 |
| 5,657,130 | * 8/1997 | Shirasu et al. | 356/401 |
| 5,912,726 | * 6/1999 | Toguchi et al. | 355/53 |
| 5,929,973 | * 7/1999 | Kakizaki et al. | 355/26 |
| 5,999,244 | * 12/1999 | Yanagihara et al. | 355/53 |

* cited by examiner

Primary Examiner—David M. Gray
Assistant Examiner—Hung Henry Nguyen
(74) Attorney, Agent, or Firm—Erik B. Cherdak & Associates, LLC.

(57) ABSTRACT

Scanning type exposure device that includes a projection optical system having a plurality of projection optical system modules configured to facilitate projection exposure of a pattern onto a photosensitive substrate based on a mask. The projection optical system modules are configured to be individually adjusted based on a displacement characteristic related to the mask. Also disclosed are methods of manufacturing and using the scanning type exposure device.

19 Claims, 7 Drawing Sheets

SCANNING TYPE EXPOSURE DEVICE HAVING INDIVIDUALLY ADJUSTABLE OPTICAL MODULES AND METHOD OF MANUFACTURING SAME

BACKGROUND OF THE INVENTION

1. Field of the Invention

The present invention relates to exposure devices such as those used to manufacture liquid crystal display panels.

2. Description of the Related Art

For many years, liquid crystal display (LCD) panels have been used in word processors, personal computers, televisions, and other display-oriented devices. To manufacture such liquid crystal display panels, it is necessary to produce patterns on transparent conductive films, amorphous silicon films, or the like disposed on glass or similar substrates by means of photolithography.

To facilitate such photolithography, step and repeat type exposure devices often are used. Such devices typically perform exposure projection of an original picture pattern formed on a mask onto a resist film disposed on a glass substrate via a projection optical system. Such exposure devices have become quite reliable in terms of facilitating manufacture of LCD panels. Unfortunately, however, as LCD "picture" sizes have increased, so too have the sizes of glass plates, masks, and exposure regions. Such increased sizes have led to several problems which have not heretofore been effectively addressed and solved.

For example, to design an enlarged projection optical system to produce relatively large LCD panels, it has become necessary to produce large optical elements that can support very high accuracy and the like. Such accuracy comes at a high price. For example, manufacturing costs are increased whenever greater device accuracy is required. Furthermore, larger optical systems require larger device infrastructures which causes increases in costs associated with device manufacture, transportation, and installation. And, to exacerbate such problems, increased exposure device size often results in poorer image projections and the like.

To address such problems, various exposure devices have been proposed. For example, as shown in U.S. Pat. No. 5,625,436, the inventors thereof proposed using a projection optical system unit consisting of plural projection optical system modules. More particularly, the inventors proposed using a scanning type exposure device of a multi-lens projection optical system which performs equal and multiple exposures while simultaneously causing a mask and substrate to move. Scanning is done while fixing in place an illuminating optical system and a projection optical system unit. By simultaneously moving the mask and a substrate, an exposure pattern (e.g., a rectangular pattern) formed on a surface of the substrate moves and, as a result, a whole exposure is achieved. When using such a projection optical system which is not very large in comparison with the size of the mask and substrate, exposure becomes possible in a region of a comparatively large image plane.

The device shown and described in the '436 patent incorporates a single projection optical system. As such, after plural projection optical system modules were assembled into the exposure device, the same were inspected by inspection devices for accuracy. Then, after an accuracy inspection, the single-part projection optical system was loaded into the exposure device. In such an inspection device, as a mask used for inspection, in at least one scan direction and a direction about at right angles, using a large mask to about the same degree as a mask used in practice, the projection optical system unit was inspected and adjusted. As such, the adjustment of the projection optical system unit was time-consuming and, in addition, the inspection device became large.

Together with larger substrates, it was necessary to make masks larger. As masks became larger, the same were recognized to bend under their own weight and size. As a result, the bending amount was large at a center portion of a mask, and became small at side portions thereof. For example, in order to perform exposure of a large substrate of say about 500 mm×650 mm, it was not uncommon to realize up to 40 $\mu$m in bending. As such, even when correctly positioned in accordance with an exposure pattern formed on a surface of a substrate there was concern that bending would cause distorted projections, etc.

Thus, there exists a need to provide new and improved scanning type exposure devices which may be used to manufacture LCD panels and the like having relatively large dimensions and surface areas. To be viable, such devices must effectively address the problems stated above and, in particular, those related to mask bending.

SUMMARY OF THE INVENTION

The present invention solves the aforementioned problems associated with prior scanning type exposure devices. In so doing, the present invention provides a new and improved scanning type exposure device and methods of manufacturing and using the same which can perform high accuracy exposures without regard for displacement of a mask such as realized by masks that bend under their own weight, size, etc. As a result, the present invention achieves lower device adjustment times, reduce inspection device sizes, and lower manufacturing costs.

The present invention solves the aforementioned problems and achieves the above-described benefits by providing a scanning type exposure device that includes a projection optical system having a plurality of projection optical system modules configured to facilitate projection exposure of a pattern onto a photosensitive substrate based on a mask. The projection optical system modules are configured to be individually adjusted based on a displacement characteristic related to the mask. Additionally, the present invention provides corresponding methods of manufacturing and using the scanning type exposure device.

BRIEF DESCRIPTION OF THE DRAWING FIGURES

The present invention is described below with reference to the following drawing figures, of which:

DETAILED DESCRIPTION OF THE PREFERRED EMBODIMENTS

Figure 1:
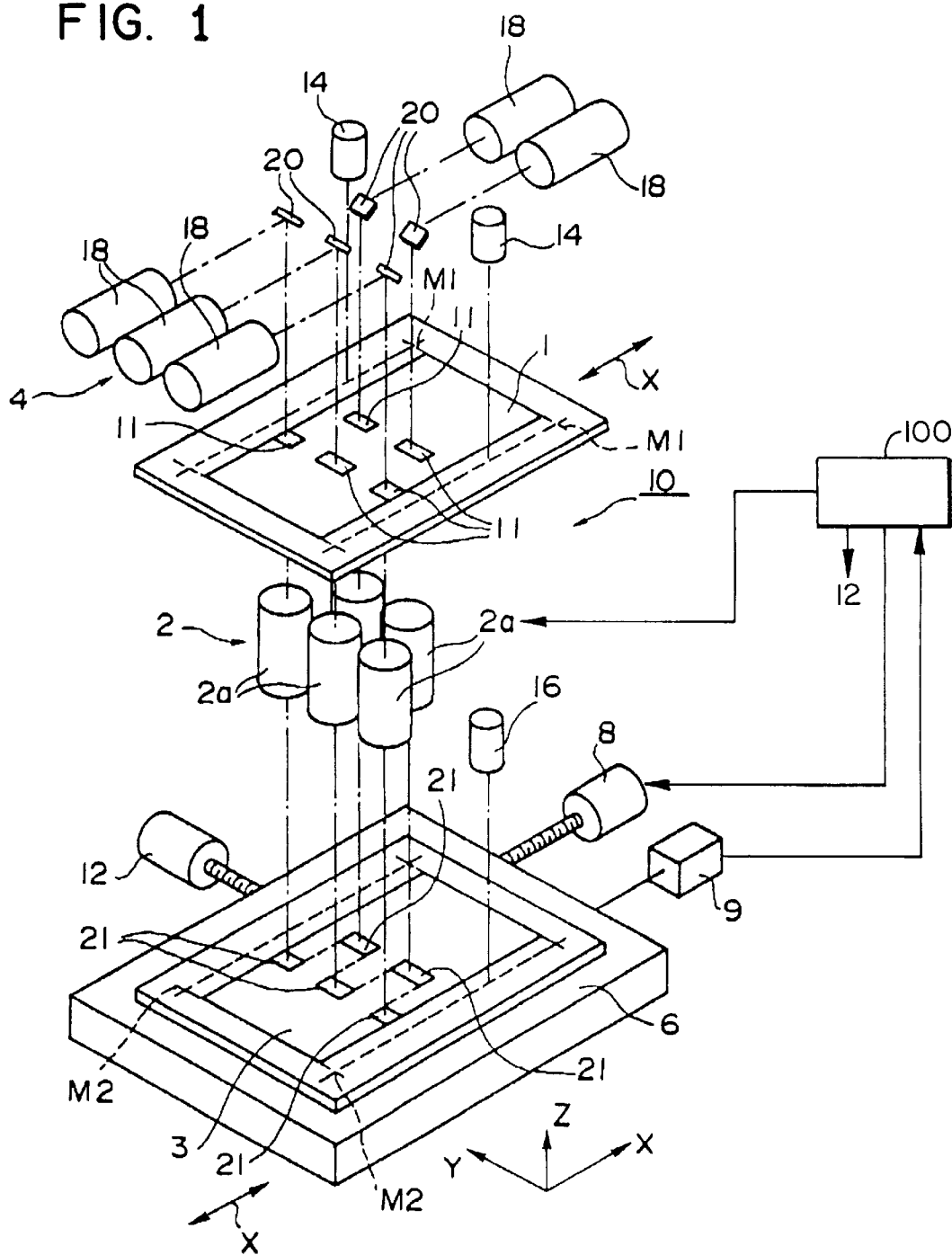
FIG. 1 is a schematic diagram of an exposure device provided in accordance with a preferred embodiment of the present invention.

The present invention is now discussed with reference to the drawing figures that were briefly described above. A discussion of each preferred embodiment of the present invention is followed by a corresponding discussion of its operation. Unless otherwise specified, like parts and processes are referred to with like reference numerals.

A First Preferred Embodiment

Referring now to FIG. 1, depicted therein is a schematic diagram of a scanning type exposure device provided in accordance with a preferred embodiment of the present invention. In particular, an exposure device 10 has an illumination optical system unit 4, a mask stage (not shown) which supports a mask 1, a projection optical system unit 2, and a substrate stage 6 which supports a substrate 3. There is no particular limitation on the substrate 3, but in the present preferred embodiment, a glass substrate is used in order to manufacture a liquid crystal display panel (LCD).

A control device 100 controls the operations of scanning type exposure control device 10 and, in particular, the component parts thereof including, but not limited to, projection optical system unit 2, drive systems (described below), etc. Control device 100 may include data processing structures to allow intelligent control including control operations based on data analysis and the like.

In the present preferred embodiment, in order to manufacture a comparatively large picture LCD, a glass substrate is used having a height of 500 mm or more and a width of 650 mm or more. Polysilicon film, colorant film, transparent electrically conductive film, and other various kinds of functional thin films are laminated on the surface of substrate 3. Substrate 3 is thereafter etched with desired patterns. Accordingly, during an etching process, a film of a resist and the like photosensitive thin film is formed so that substrate 3 becomes a photosensitive substrate and so that an exposure process may be performed by scanning type exposure device 10 in accordance with the present preferred embodiment.

Figure 2:
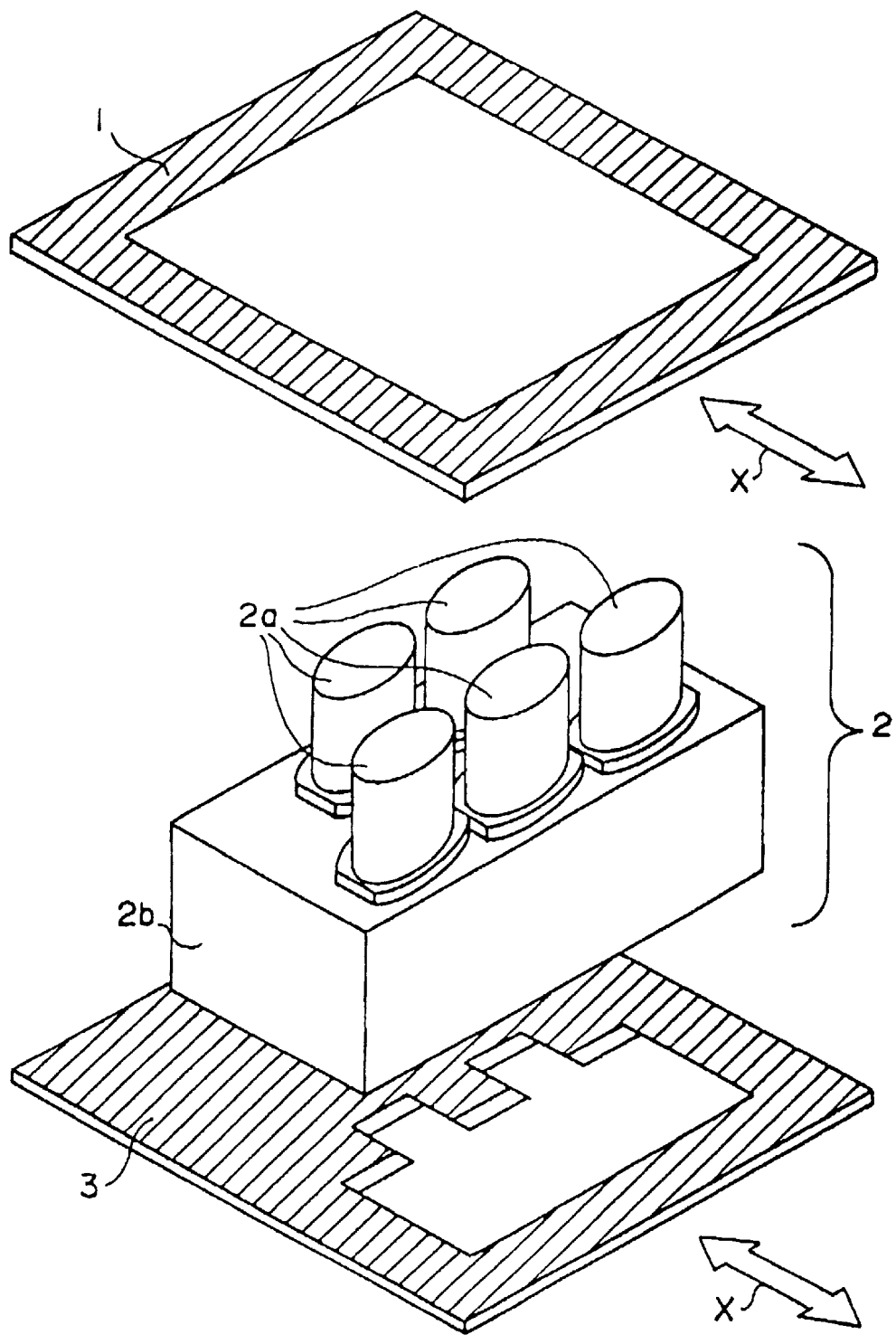
FIG. 2 is an oblique diagram of the exposure device shown in FIG. 1.

In scanning type exposure device 10 and, in particular, with respect to illumination optical system unit 4 and projection optical system 2 thereof, mask 1 and substrate 3, as shown in FIGS. 1 and 2, simultaneously move in a scan direction X. The direction approximately at right angles to the scan direction X is taken as the Y direction, and the direction approximately at right angles to both the X and Y directions is taken as the Z direction.

Substrate stage 6 supports substrate 3 and is driven in the X direction by means of a scan direction drive device 8. The amount of movement, for example, is detected with high accuracy by means of a laser interferometer and the like position measurement device 9 so that accurate movement of substrate stage 6 is performed. A Y direction drive device 12 causes movement of substrate stage 6 in the Y direction and is mounted in the substrate stage 6.

In cases in which substrate 3 is large in comparison to mask 1, the amount of movement of substrate stage 6 in the Y direction becomes large.

A scan direction drive device, a Y direction drive device, and a position measurement device also are provided in the mask stage (not shown) which supports mask 1. Position matching of mask 1 and substrate 3 is performed by an alignment sensor 14 which detects an alignment mark M1 formed in mask 1, and an alignment sensor 16 which detects an alignment mark M2 formed in substrate 3. The present invention is not limited to utilizing alignment sensors 14 and 16.

Illumination optical system unit 4 has a structure suitable for forming on mask 1 plural (e.g., five, etc.) rectangular illumination regions 11 which are located in two (2) rows in the Y direction and which are mutually and alternately located in the X direction. Namely, illumination optical system unit 4 of the present preferred embodiment has plural light exit modules 18 which are used to supply illumination light for exposures. For example, g light (436 nm) or i light (365 nm) may be illuminated from each light exit module 18. Light exit modules 18 have respective single light sources, or secondary light sources from a single light source, and via built-in condensing lenses, uniformly illuminate field stops which have rectangular apertures. Illuminating light for exposure has its light path rotated 90° by mirror 20 and reaches the surface of mask 1 to form plural rectangular illumination regions 11 which are images of the rectangular apertures of the field stops.

The shape of the respective illumination regions need not be rectangular. Furthermore, the number of illumination regions 11 located alternately at a predetermined pitch in two rows along the Y direction on mask 1 is not limited to five (5), and may be four (4) or less, or six (6) or more. The number of illumination regions 11 corresponds to the number of illumination regions used to illuminate the substrate.

Next, a description is given of projection optical system unit 2 as shown in FIGS. 1 and 2. Projection optical system unit 2 has a support base 2b which has a comparatively high rigidity and which remains relatively stiff. A number of projection optical system modules 2a (e.g., five modules, etc.) are mounted on support base 2b and correspond to the number of illumination regions 11 formed by illumination optical system unit 4. The respective projection optical system modules 2a, in the present preferred embodiment, are optical systems with uniform magnification to produce erect normal images.

Figure 3:
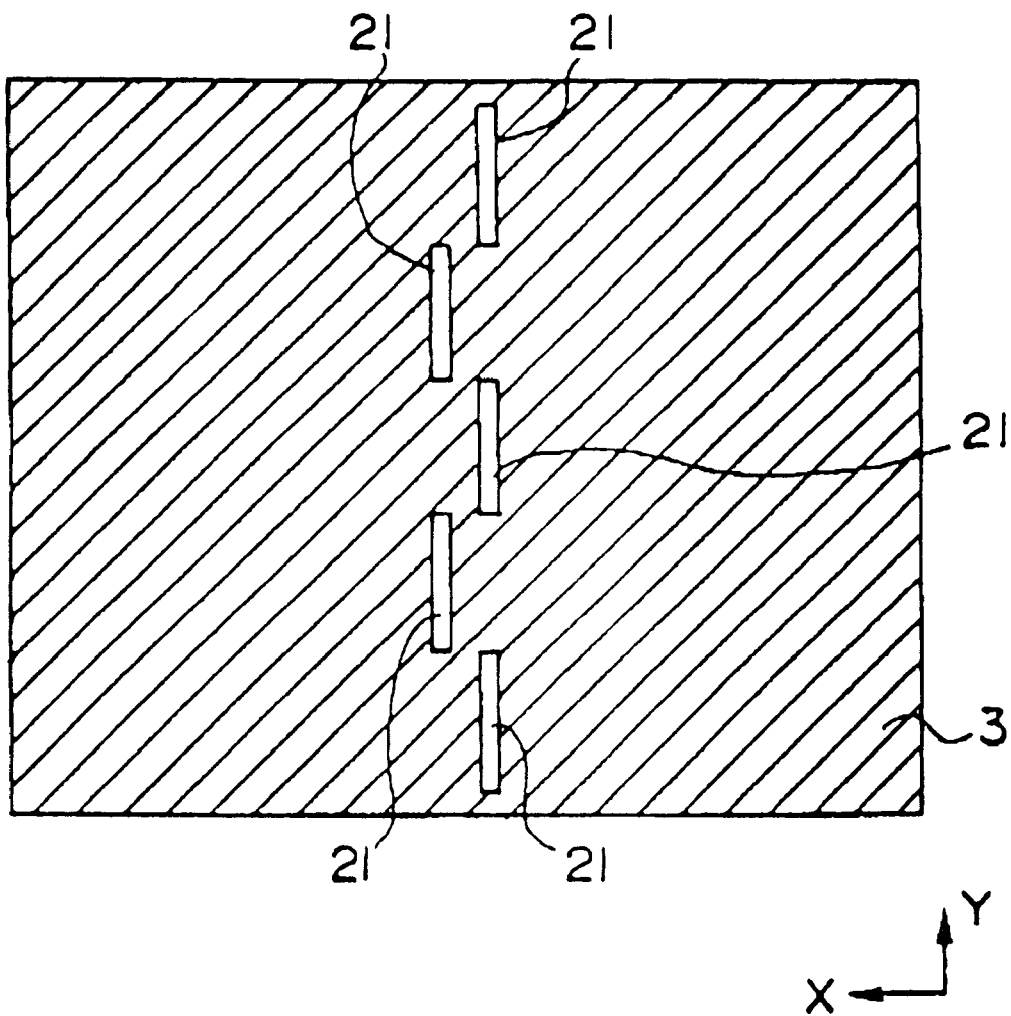
FIG. 3 is a plan view that illustrates the positional relationship of the exposure regions formed on the surface of a substrate.

Projection optical system modules 2a all have the same structure, and are optical systems which perform projection exposure causing imaging on the surface of the substrate 3 for the respective exposure regions 21 of patterns on mask 1 which correspond to the respective illumination regions 11 which are illuminated with respect to mask 1. Accordingly, the structure of (e.g., shape, dimensions, etc.) of projection optical system modules 2a is not limited to that shown in FIGS. 1 and 2. The respective projection optical system modules 2a of projection optical system unit 2 have field stop regions of the prescribed rectangular shape by means of field stops within the respective projection optical system modules 2a; images of such field regions are formed as erect images of equal magnification on substrate 3, and become two rows of exposure regions 21 located alternately as shown in FIG. 3. That is, on the substrate 3, by means of the respective projection optical system modules 2a located in the projection optical system unit 2, five (5) rectangular exposure regions 21 are formed arrayed alternately in 2 rows by projection optical system unit 2. The Y-direction end portions of the respective exposure regions 21 formed on substrate 3, between the adjacent exposure regions 21, are separated at a predetermined pitch in the X direction. In the Y direction, the end portions thereof overlap.

Figure 4:
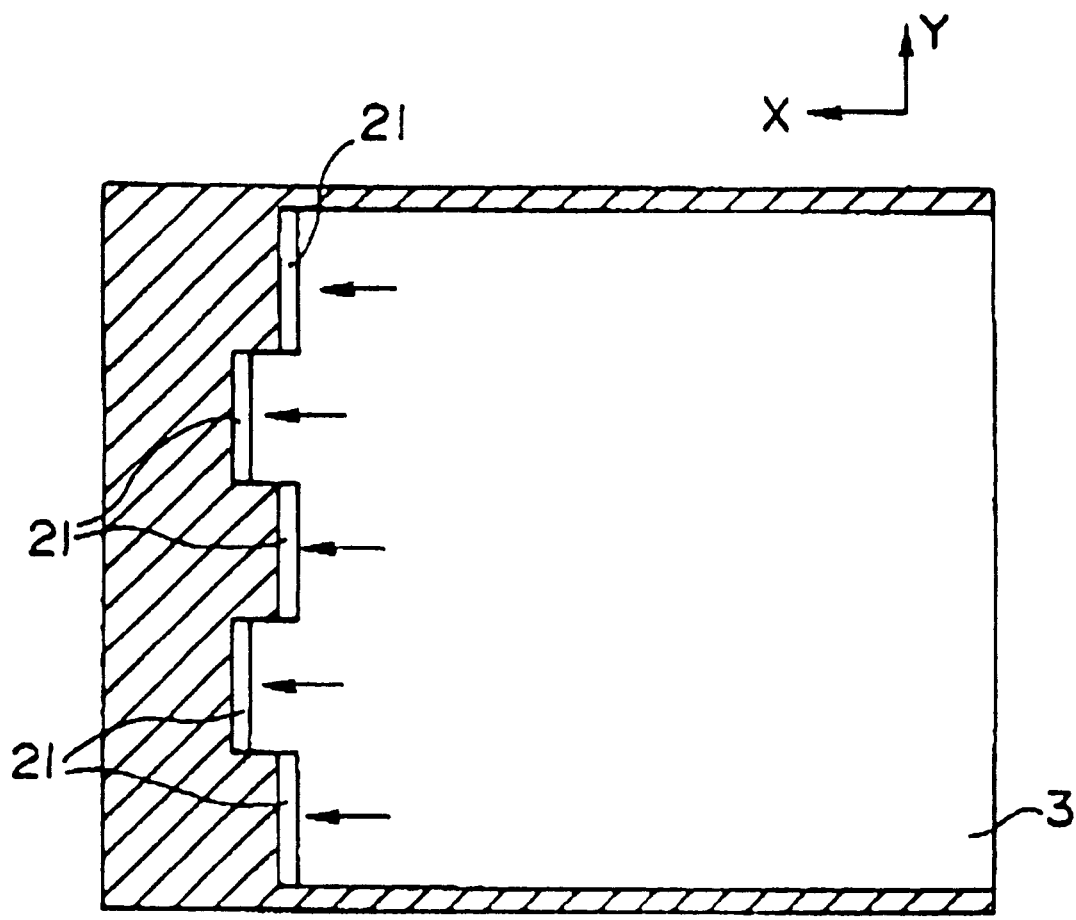
FIG. 4 is a plan view that illustrates the scanning movement of the exposure regions formed on the surface of a substrate.

Mask 1 and substrate 3 as shown in FIGS. 1 and 2 are in a state which they do not move simultaneously in scan direction X. The exposure region 21 formed by means of illumination optical system 4 and projection optical system unit 2, as shown in FIG. 3, is only a partial region in the scan direction X. However, by means of simultaneously moving mask 1 and substrate 3 in scan direction X, as shown in FIG. 4, the respective exposure regions 21 correspondingly move in scan direction X on the surface of the substrate 3 and the whole surface of substrate 3 can be exposed.

Figure 5:
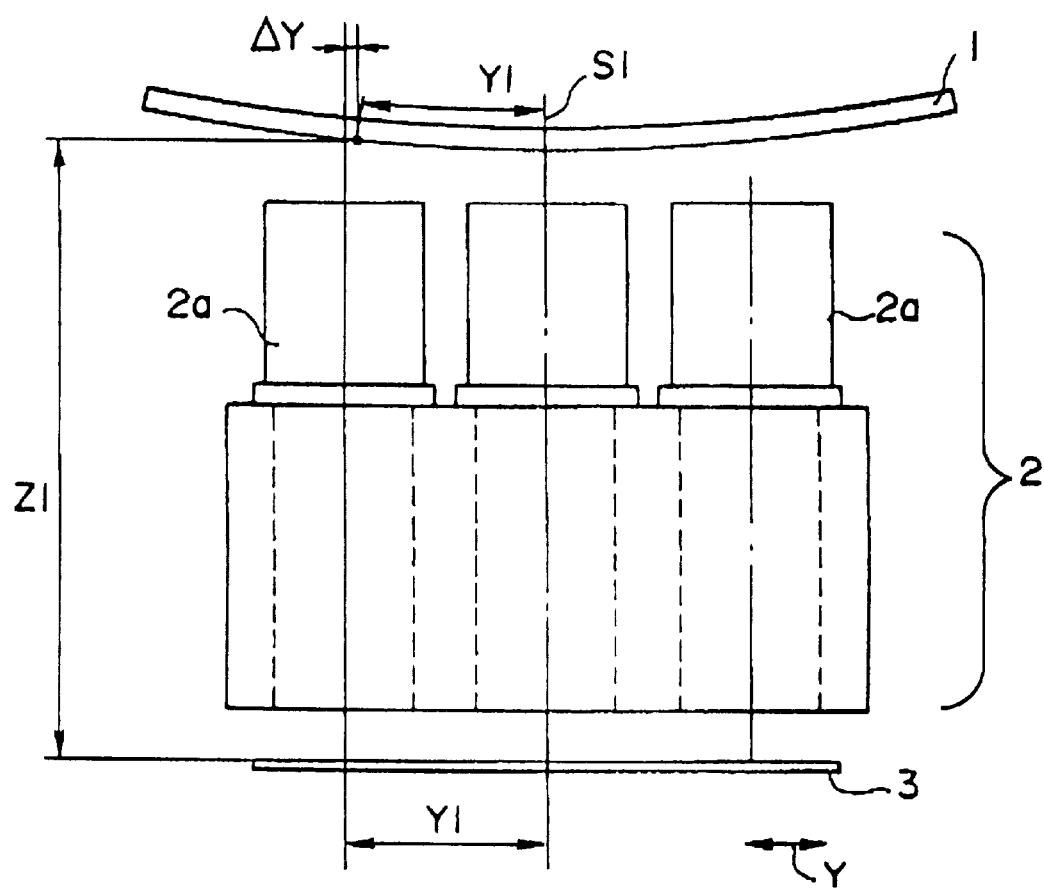
FIG. 5 is a schematic diagram that illustrates the relationship of the bending of a mask and the projection optical system modules.

With scan type exposure device 10, as shown in FIG. 5, for example, mask 1 deforms due to bending as a result of its own weight, size, etc. As a result, a position deviation $\Delta Y$ results between the position of Y1 along mask 1 from the scan center line S1 of the Y direction of the mask 1 and substrate 3, and the position of Y1 along the substrate 3. When substrate 3 is large and mask 1 is correspondingly large, $\Delta Y$ causes a large distortion effect on the exposure. Moreover, due to the bending deformation of mask 1, the change of the distance between foci Z1 also cannot be neglected.

Consequently, the deviation amounts $\Delta Y$ corresponding to the optical center axes of the respective projection optical system modules 2a, and the distance between foci Z1, taking into account the bending deviation of the mask 1 due to its own weight, size, etc. are found prior to exposure operations based on estimation and calculation techniques (i.e., a distortion simulation result is determined). Such evaluations may be carried out by control device 100 using programmatic control logic that includes mathematical operations to take differences between relative positional placements, etc. Thereafter, during inspection of projection optical system unit 2 and before mounting the respective projection optical system modules 2a shown in FIG. 2 on support base 2b, each of the respective projection optical system modules 2a is individually adjusted using the inspection device shown in FIG. 6.

Figure 6:
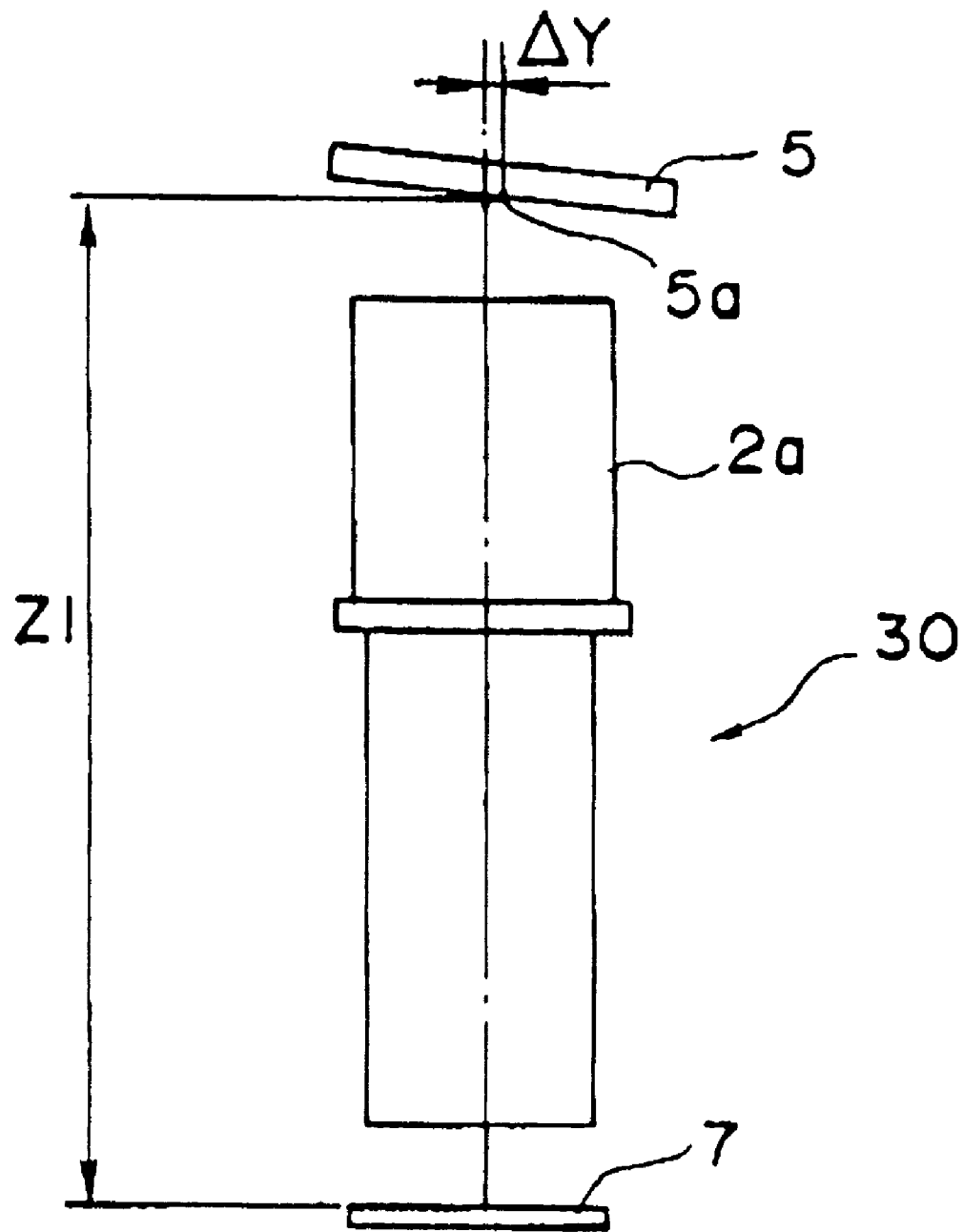
FIG. 6 is a schematic diagram of an inspection device projection optical system module provided in accordance with a preferred embodiment of the present invention.

The inspection device 30 shown in FIG. 6 has a temporary support base (not shown) which temporarily supports projection optical system unit 2, a mask stage (not shown) which supports mask 5, and a substrate holder (not shown) which supports substrate 7. The inspection mask stage which supports mask 5 for inspection use is movable in six degrees of freedom.

In adjusting a respective projection optical system module 2a using inspection device 30, the projection optical system module 2a is temporarily supported on the temporary support base. Thereafter, the center 5a of mask 5 is caused to move based on the aforementioned simulation result such that the Y direction position deviation amount $\Delta Y$ and the distance between foci Z1 correspond to the respective projection optical system module 2a. Accordingly, the tilt angle of lenses and the interval between lenses and the like which constitute the respective projection optical system module 2a are adjusted so as to position the image of the center 5a of the mask 5 with respect to the center of substrate 7.

After each projection optical system module has been adjusted, the group is mounted in the support base as shown in FIG. 2, and the projection optical system unit 2 is thereby assembled. Furthermore, on support base 2b, plural projection optical system modules 2a are also mounted, and it is necessary for it to be of high rigidity to the extent that problems during exposure such as bending deformation and the like do not arise. Moreover, during inspection support base 2b may be used instead of the temporary arrangement shown in FIG. 6.

When an exposure operation is performed on substrate 3 of comparatively large size, the deformation of mask 1 due to bending of mask 1 is simulated prior to exposure operations, and based on the deformation of mask 1. In particular, a position deviation $\Delta Y$ and distance between foci Z1 and the like values of change are evaluated beforehand. Such values and the location of the respective projection optical system modules 2a with respect to the support base 2b of the projection optical system unit 2 are evaluated using inspection device 30 to individually adjust projection optical system modules 2a. As such, adjusted projection optical system modules 2a are inserted into support base 2b to assemble projection optical system unit 2.

In the present preferred embodiment, exposures of substrates of relatively large size can be performed with high accuracy, without regard for deformation of a mask due to bending of the same under its own weight, size, etc. Moreover, because each projection optical system module 2a is individually inspected and adjusted, inspection device 30 is of reduced size relative to other adjustment devices. And, when a non-conformity (e.g., malfunction, etc.) arises in one of the projection optical system modules 2a of projection optical system unit 2, the same may now be easily exchanged.

A Second Preferred Embodiment

Next described is a second preferred embodiment of the present invention. The structure of the second preferred embodiment is the same as that discussed above with regard to the first described preferred embodiment. Here, each projection optical system module 2a is individually adjusted by means of inspection device 30 as shown in FIG. 6 based on its position within support base 2b. That is, in contrast to using a temporary support base as described above with regard to FIG. 6, the present preferred embodiment uses support base 2b. In particular, the bend deformation of mask 1 as shown in FIG. 5 is evaluated prior to exposure, and based on the result of such an evaluation and according to the position of each projection optical system module within base 2b so that each projection optical system module is separately configured and adjusted.

With the present preferred embodiment, because the optical system modules 2a are configured based, in part, on their position within support base 2b, inspection time using inspection device 30 as shown in FIG. 6 is shortened especially since removal and placement of the same into a temporary support member is not needed.

A Third Preferred Embodiment

Next described is a third preferred embodiment of the present invention. With the first and second preferred embodiments described above, individual adjustment of a particular optical system module 2a is performed with respect to its position within a support member such as support base 2b or other temporary structure. In contrast, the present preferred embodiment utilizes scanning traits to achieve adjustment. That is, as the scan movement directions X and Y are approximately at right angles relative to each other, by linearly and symmetrically inserting the center line S1 (see FIG. 5) of scan movement will causes projection optical system modules 2a to be in a linear, symmetric relationship. As such, projection optical system modules 2a may be adjusted in similar fashion if the center line of mask 1 and the center line S1 of the scan direction are in agreement. Because mask 1 deforms (e.g., bends, etc.) symmetrically with respect to the center line S1 of scan movement, the position deviation amount ΔY and the distance between foci Z of mask 1 with respect to a projection optical system module 2a is linear and symmetric, and can be considered to be approximately the same for all projection optical system modules.

Accordingly, in the context of the present preferred embodiment, it is not necessary to individually adjust all of the projection optical system modules 2a which are mounted with respect to support base 2b. Instead, each projection optical system module 2a may be adjusted based on certain assumptions derived from scanning traits.

It should be noted that in the case that mask 1 is quartz or low expansion glass, the amount of bending that will be realized is different than as described above. Also, in cases in which a mask is used whose size or thickness differs from those described above, the amount of bending of that mask will be different. In such cases, information (material, size, etc.) relating to mask 1 may be input to control device 100, and the focus adjustment lens in each projection module 2a may be adjusted. Furthermore, the information relating to mask 1 may be read out from the bar code formed in the mask 1, or may be input manually to a controller such as control device 100.

Other Embodiments

Figure 7:
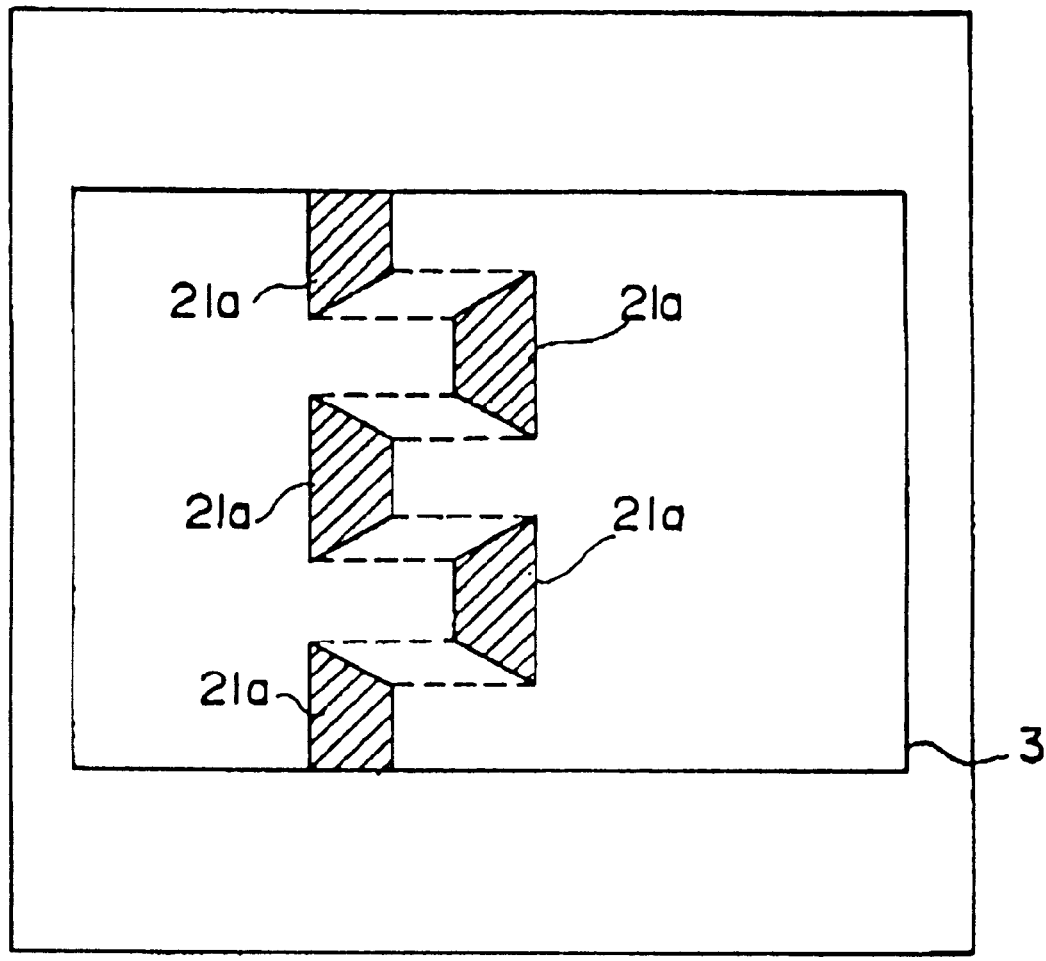
FIG. 7 is a plan view that illustrates the positional relationship of exposure regions formed by means of a projection optical system unit of an exposure device according to another preferred embodiment of the present invention.

The present invention is not limited to the above-described preferred embodiments. For example, the exposure regions formed by the respective projection optical system modules 2a need not necessarily be formed as rectangular regions 21. As shown in FIG. 7, projection optical system modules 2a may be designed so as to form trapezoidal exposure regions 21a. Additionally, as shown in FIG. 7, a positional relationship of 2 rows of trapezoidal exposure regions along the Y direction may be separated at a predetermined pitch in the scan direction X and caused to overlap as seen in the scan direction X. By forming exposure regions 21a by the respective projection optical system modules 2a in such a way, the pattern located in the joint portion of the respective exposure region 21a does not leave any unexposed area on the surface of substrate 3.

Moreover, In the above-mentioned embodiments, the respective projection optical system modules 2a of the projection optical system unit 2 are an optical system of equal magnification to produce erect images. The present invention, however, is so limited. To the contrary, the present invention may incorporate optical systems that provide reduction optical effects, enlargement optical effects, inverted images, etc.

Also, illumination optical system unit 4 includes plural lenses to perform optical adjustment of the projection optical system unit containing a focusing lens which is inserted in the exposure device housing. Additionally, substrate stage 6 includes many mechanical components and is mounted in the housing of scanning type exposure device 10. Such structures are assembled to connect to a wiring system (now shown). Furthermore, scanning type exposure device 10 can be manufactured by means of performing coordination adjustment (electrical adjustment, operational confirmation, and the like). It is desirable to manufacture scanning type exposure device 10 in a clean room with controlled temperature and cleanliness.

Based on the foregoing discussion, when performing exposure of photosensitive substrates of comparatively large size, it is possible to perform exposures with high accuracy, without effects due to the deformation of a mask resulting from bending under its own weight, size, etc. Moreover, because projection optical system modules may be individually inspected and adjusted, in accordance with the present invention, an inspection device can be designed in a smaller form, the adjustment time can be shortened, and cost reductions can be achieved.

Moreover, when a non-conformity arises (e.g., a malfunction, etc.) in one of the projection optical system modules occurs, only the effected projection optical system module need be exchanged, repaired, etc.

The present invention is not limited as to individual adjustment of the respective projection optical system modules 2a. Instead, the present invention contemplates adjustment of the tilt angle of the lenses which are included within a respective projection optical system module 2a, intervals between lenses, rotation angles of lenses (rotation around an optical axis), eccentricity of the lenses, and the like, to perform exposure at an optimal focus state in relation to a photosensitive substrate. Moreover, individual adjustment of the respective photosensitive substrates means that by specially designing the kind of lenses included within the respective projection optical system modules, tilt angle, interval between lenses, lens thickness, lens surface curvature and the like for each respective projection optical system module, is such as to perform exposure at an optimal focus state in relation to a photosensitive substrate.

With an exposure device provided in accordance with the present invention, when performing exposure of photosensitive substrates of a relatively large size, performing a simulation/evaluation of the deformation of a mask due to the mask bending under its own weight, size, etc., the values of the change of the positional deviation amount and distance between foci and the like are estimated prior to exposure. Taking such values and the locations of the respective projection optical system modules of a projection optical system unit, the projection optical system modules may be individually adjusted. Accordingly, the projection optical system modules whose adjustment is completed are assembled in the projection optical system.

As such, when performing exposures of photosensitive substrates of comparatively large sizes, exposures can be performed with high accuracy, without displacement of a mask due to bending under its own weight, size, etc. Moreover, in contrast to the prior art, there is no single inspection for a whole projection optical system unit because the respective projection optical system modules may be individually inspected and adjusted, providing for a reduced size of inspection device, shortening of the adjustment time and a reduction in manufacturing costs.

Furthermore, in the context of the present invention, mask 1 is generally considered to be one containing a reticle. Moreover, in the present invention, the light source of the exposure device 10 is not limited. In fact, light sources such as those that produce g light (436 nm), i light (365 nm), and that light produced by KrF excimer lasers (248 nm), ArF excimer lasers (193 nm), $F_2$ lasers (157 nm) or YAG lasers and other high frequency light sources may be used.

Thus, having fully described the present invention by way of example with reference to the attached drawing figures, it will be readily appreciated that many changes and modifications may be made to the invention and to the embodiments shown and/or described herein without departing from the spirit or scope of the present invention which is defined in and covered by the appended claims.

What is claimed is:

1. A scanning type exposure device, comprising:
   a projection optical system having a plurality of projection optical system modules configured to facilitate projection exposure of a pattern onto a photosensitive substrate based on a mask;
   a detector that detects a displacement characteristic of said mask caused by the weight of said mask; and
   an adjustment device that individually adjusts each projection optical system module of said plurality of projection optical system modules based on said displacement characteristic detected by said detector.

2. The scanning type exposure device according to claim 1, wherein said displacement characteristic corresponds to a bend displacement caused by the size of said mask.

3. The scanning type exposure device according to claim 1, wherein said mask and said photosensitive substrate are movably supported and are caused to move to facilitate scanning, said projection optical system disposed between said mask and said photosensitive substrate.

4. The scanning type exposure device according to claim 1, wherein said projection optical system modules are uniformly adjusted based on said displacement characteristic.

5. The scanning type exposure device according to claim 1, further comprising a base member supporting said projection optical system modules, each projection optical system module of said plurality of projection optical system modules be adjusted based on said displacement characteristic and a position of said each projection optical system module within said base member.

6. The scanning type exposure device according to claim 1, further comprising an adjustment device and a temporary base member for individually supporting each projection optical system module of said plurality of projection optical system modules, each projection optical system module of said plurality of projection optical system modules being adjusted based on said displacement characteristic and a position of said each projection optical system module within said temporary base member when so disposed.

7. The scanning type exposure device according to claim 1, wherein said plurality of projection optical system modules are adjusted based on dimensional relationships between said mask and said photosensitive substrate.

8. A method of manufacturing an exposure device that exposes a pattern of a mask onto a photosensitive substrate, comprising the steps of:
   detecting a displacement characteristic related to said mask caused by the weight of said mask;
   adjusting a projection optical system having a plurality of projection optical system modules, each projection optical system module of said plurality of projection optical system modules being adjusted individually based on said displacement characteristic; and
   assembling said plurality of projection optical system modules to produce said exposure device.

9. The method according to claim 8, wherein displacement characteristic relates to bend characteristics of said mask and said providing step includes the step of configuring said projection optical system modules to be individually adjusted based on said bend characteristics.

10. A scanning type exposure device, comprising:
    a projection optical system having a plurality of projection optical system modules configured to facilitate projection exposure of a pattern onto a photosensitive substrate based on a mask;
    a detector that detects a displacement characteristic related to said mask caused by the weight of said mask; and
    a controller configured to adjust each projection optical system module of said plurality of projection optical system modules individually based on said displacement characteristic detected by said detector.

11. The scanning type exposure device according to claim 10, wherein said projection optical system further comprises a base member supporting said plurality of projection optical system modules and said plurality of projection optical system modules are adjusted based on their positions within said base member.

12. The scanning type exposure device according to claim 10, wherein said projection optical system modules are uniformly adjusted based on said displacement characteristic.

13. The scanning type exposure device according to claim 10, wherein said displacement characteristic corresponds to a bend displacement caused by the size of said mask.

14. The scanning type exposure device according to claim 10, further comprising a base member supporting said plurality of projection optical system modules, each projection optical system module of said plurality of projection optical system modules being adjusted based on said displacement characteristic and a position of said each projection optical system module within said base member.

15. The scanning type exposure device according to claim 10, further comprising a temporary base member for individually supporting each projection optical system module of said plurality of projection optical system modules, each projection optical system module of said plurality of projection optical system modules being adjusted based on said displacement characteristic and a position of said each projection optical system module within said temporary base member when so disposed.

16. The scanning type exposure device according to claim 10, wherein said plurality of projection optical system modules are adjusted based on dimensional relationships between said mask and said photosensitive substrate.

17. A method of using an exposure device having a projection optical system further having a plurality of projection optical system modules configured to facilitate projection exposure of a pattern onto a photosensitive substrate based on a mask, comprising the steps of:
    installing said mask and said photosensitive substrate into said scanning type exposure device;
    detecting a displacement characteristic related to said mask caused by the weight of said mask;
    adjusting each projection optical system module of said plurality of projection optical system modules individually based on said displacement characteristic detected during said detecting step; and
    exposing said photosensitive substrate based on said mask after completing said adjusting step.

18. The method according to claim 17, wherein said exposure device is a scanning type exposure device.

19. The method according to claim 17, wherein said projection optical system projects said pattern such that portions of said pattern overlap each other.

* * * * *